310-322 SR
4/15/86 XR 4,583,101

United States Patent [19]
Braun

[11] Patent Number: 4,583,101
[45] Date of Patent: Apr. 15, 1986

[54] FLUID JET PRINT HEAD AND STIMULATOR THEREFOR

[75] Inventor: Hilarion Braun, Xenia, Ohio

[73] Assignee: Eastman Kodak Company, Rochester, N.Y.

[21] Appl. No.: 771,467

[22] Filed: Aug. 30, 1985

Related U.S. Application Data

[63] Continuation of Ser. No. 453,082, Dec. 27, 1982, abandoned.

[51] Int. Cl.4 .......... G01D 15/18; H01L 41/08
[52] U.S. Cl. .......... 346/75; 310/322; 310/323
[58] Field of Search .......... 346/75, 140 R; 310/26, 310/323, 325, 322

[56] References Cited

U.S. PATENT DOCUMENTS

| | | | |
|---|---|---|---|
| 2,514,080 | 7/1950 | Mason | 171/327 X |
| 2,573,168 | 10/1951 | Mason | 171/330 X |
| 2,998,535 | 8/1961 | Church et al. | 310/8.3 |
| 3,113,225 | 12/1963 | Kleesattel et al. | 310/26 |
| 3,666,678 | 6/1972 | Haskell | 239/102 |
| 3,701,998 | 10/1972 | Mathis | 346/75 |
| 3,739,393 | 6/1973 | Lyon et al. | 346/1 X |
| 3,815,129 | 6/1974 | Sweany | 340/388 |
| 3,850,717 | 11/1974 | Keur et al. | 156/86 |
| 3,972,474 | 8/1976 | Keur | 239/102 |
| 4,122,365 | 10/1978 | Stephens | 310/324 |
| 4,228,440 | 10/1980 | Horike et al. | 346/75 |
| 4,231,047 | 10/1980 | Iwasaki et al. | 346/75 |
| 4,240,081 | 12/1980 | Devitt | 346/75 |
| 4,243,995 | 1/1981 | Wright et al. | 346/140 R |
| 4,290,074 | 9/1981 | Royer | 346/75 |
| 4,366,490 | 12/1982 | De Bonte et al. | 346/140 |

OTHER PUBLICATIONS

Ultrasonics, 2d ed., 1960, B. Carlin, p. 116.

*Primary Examiner*—E. A. Goldberg
*Assistant Examiner*—Gerald E. Preston
*Attorney, Agent, or Firm*—Biebel, French & Nauman

[57] ABSTRACT

A fluid jet print head includes an orifice plate defining a plurality of orifices from which fluid emerges, and a stimulator means mounted in contact with the orifice plate for vibrating the orifice plate to produce a series of bending waves. The bending waves travel along the orifice plate and break up the fluid into drops of substantially uniform size and spacing. The stimulator means includes a stimulator member of a length equal to an integer half wavelength of acoustic waves of a frequency f passing therethrough. The stimulator member contacts the orifice plate at one end of the member. A pair of piezoelectric crystals are mounted on opposite sides of the stimulator member and, when driven by an appropriate A.C. drive signal, cause acoustic waves of a frequency f to pass along the member. The member is supported at a nodal plane. The member may enter the print head manifold and contact the orifice plate internally, with a seal arrangement being provided at a nodal plane along the member. Alternatively, a pin, mounted on the end of the stimulator member, such as a half wave member, may be used to transmit mechanical vibrations to the orifice plate.

18 Claims, 4 Drawing Figures

FLUID JET PRINT HEAD AND STIMULATOR THEREFOR

This is a continuation of co-pending application Ser. No. 06/453,082, filed Dec. 27, 1982 now abandoned.

BACKGROUND OF THE INVENTION

This invention relates generally to fluid jet printing and, more particularly, to a fluid jet print head and stimulator which are simple in construction and which provide reliable drop breakup.

Jet drop printers are known in which a plurality of streams of drops are produced by a single fluid jet print head. The print head includes a manifold, defining a fluid receiving reservoir, and an orifice plate, defining a plurality of orifices which communicate with said reservoir. As ink is applied under pressure to the fluid receiving reservoir, it flows through the orifices in the orifice plate and emerges from the orifices as continuously flowing fluid filaments. The filaments tend to break up into drops of irregular and unpredictable size and spacing. Such jet drop streams are generally unacceptable for purposes of printing. It is known that to enhance drop formation, mechanical disturbances may be produced in the fluid or the print head structure and coupled to the fluid filaments.

One exceptionally effective prior art technique for producing uniform drop breakup is shown in U.S. Pat. No. 3,701,998, issued Oct. 31, 1972, to Mathis, and assigned to the assignee of the present invention. In the Mathis printer, a probe, coupled to an electromechanical transducer, extending into the fluid receiving cavity of the print head, contacts the interior surface of the orifice plate at one end of the plate. The electromechanical transducer vibrates the probe and the orifice plate is caused to vibrate at the point of probe contact. This, in turn, produces bending waves which travel along the length of the orifice plate. The bending waves produce surface vibrations on the fluid filaments which result in drop breakup in the desired manner.

The prior art printers which operate on the basis of traveling wave stimulation of this type have included relatively complicated piezoelectric, electromechanical transducers in the stimulator structures. Not only are such transducer devices expensive, but they are also somewhat unreliable. Further, the amplitude of the mechanical vibration produced may vary. Accordingly, it is seen that there is a need for a fluid jet print head, and a stimulator therefor, which are simple in construction, and reliable in operation and which provide for vibrational amplitude monitoring.

SUMMARY OF THE INVENTION

A fluid jet print head for producing a plurality of jet drop streams includes manifold means defining a fluid receiving reservoir to which fluid may be applied under pressure. An orifice plate means is mounted on the manifold means and defines a plurality of orifices which communicate with the fluid receiving reservoir such that fluid from the reservoir flows through the orifices and emerges therefrom as fluid filaments. A stimulator means is mounted in contact with the orifice plate means for vibrating the orifice plate means to produce a series of bending waves which travel along the orifice plate means and break up the fluid filaments into drops of substantially uniform size and spacing.

The stimulator means includes a stimulator member of the length which is substantially equal to $n\lambda/2$, where n is a positive integer and $\lambda$ is the wavelength of an acoustic wave traveling along the stimulator member. $\lambda$ is equal to $(Y/\rho)^{\frac{1}{2}}/f$, where Y is Young's modulus, $\rho$ is the density of the stimulator member, and f is the frequency of acoustic waves generated in the member. The member contacts the orifice plate means at one end of the member.

The stimulator means further includes piezoelectric crystal means, mounted on the stimulator member, for alternately compressing and extending in a direction parallel to the axis of elongation of the member when driven by an electrical drive signal so as to produce acoustic waves in the member. Mounting means support the stimulator member at a nodal plane therealong. A driver means applies the electrical drive signal to the piezoelectric crystal means at the frequency f.

The length of the print heat may be such that n is greater than or equal to 2. The stimulator means may contact the orifice plate means inside the manifold means, entering the manifold means through an opening including a seal. The seal contacts the stimulator member at a nodal plane along the stimulator member.

The piezoelectric crystal means may include a pair of piezoelectric crystals mounted on opposite sides of the member, the piezoelectric crystals being of the length which is less than or equal to $\frac{1}{4}\lambda$.

The stimulator member may be of a length equal to $\frac{1}{2}\lambda$. The stimulator means may further include a pin, mounted on the end of the member, in direct contact with the orifice plate means. The pin has a cross-sectional area, taken in a plane perpendicular to the axis of elongation of the member, which is substantially less than the cross-sectional area of the member taken in a parallel plane.

The stimulator means may further comprise a feedback transducer means which is mounted at the end of the member, opposite the end which contacts the orifice plate means, and which provides an electrical signal proportional in frequency and amplitude to the frequency and amplitude of the acoustic waves passing through the member.

The stimulator member may be tapered toward the end thereof which contacts the orifice plate means such that the member contacts the orifice plate means substantially at a point.

Accordingly, it is an object of the present invention to provide a fluid jet pring head, and a stimulator therefor, in which the stimulator includes an elongated member of a length substantially equal to an integer half wavelength of acoustic waves of a specific frequency in the member, a transducer arrangement for producing acoustic waves in the member in response to an A.C. drive signal, and means for applying the A. C. drive signal at the predetermined frequency to the transducer; to provide such a print head and stimulator therefor in which the transducer means includes a pair of piezoelectric transducers which are bonded to opposite sides of the stimulator member, with the transducers extending in opposite directions from a nodal place parallel to the axis of elongation of the member; to provide such a print head and stimulator therefor in which the stimulator member is mounted at a nodal plane therealong, which nodal plane may coincide with the plane from which the piezoelectric transducers extend; to provide such a print head and stimulator therefor in which the stimulator contacts the interior of the print head structure, entering the print head through an opening which is sealed by a seal surrounding the member and contacting the member at a nodal plane; to provide such a print head and stimulator therefor in which a relatively thin pin, having a cross-sectional area substantially less than the cross-sectional area of the stimulator member, extends into the print head and contacts the print head structure; and to provide such a print head and stimulator therefor in which a sensor is mounted on the member to provide an electrical feedback signal proportional in amplitude and frequency to the acoustic waves which pass along the member.

Other objects and advantages of the invention will be apparent from the following description, the accompanying drawings and the appended claims.

DETAILED DESCRIPTION OF THE PREFERRED EMBODIMENTS

Figure 1:
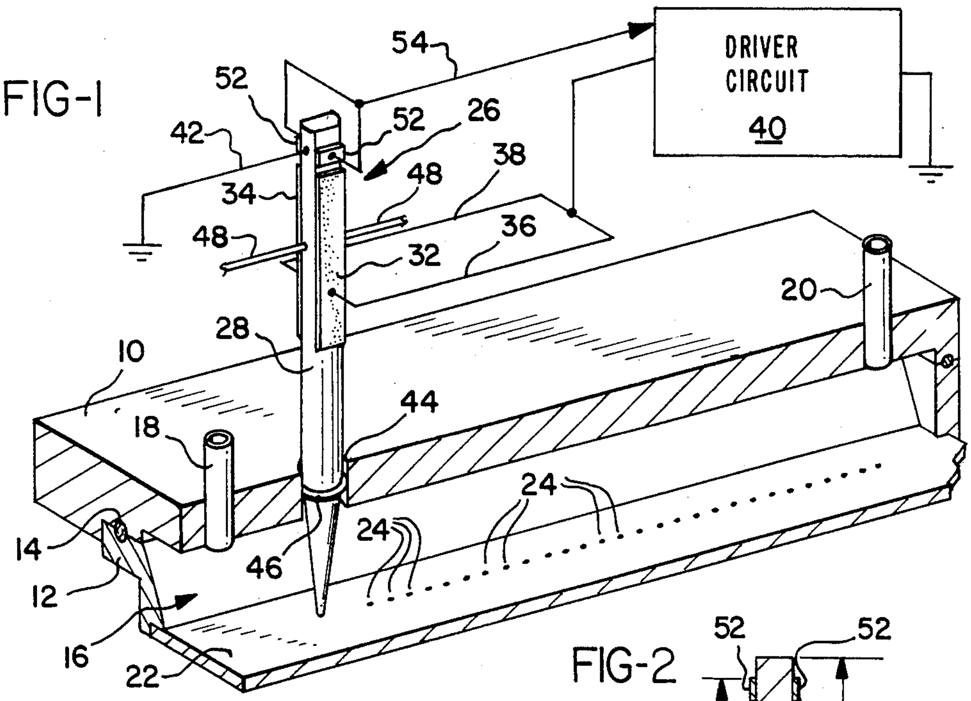
FIG. 1 is a perspective view of a first embodiment of the print head and stimulator of the present invention, with portions broken away to reveal interior structure.
Figure 2:
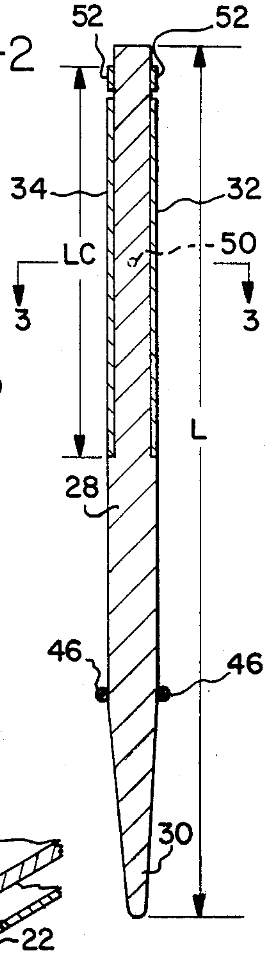
FIG. 2 is a sectional view of the stimulator of FIG. 1, taken through the center of the stimulator in a plane parallel to the axis of elongation thereof.
Figure 3:
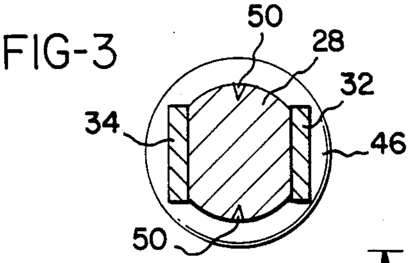
FIG. 3 is a sectional view taken generally along line 3—3 in FIG. 2.

FIGS. 1, 2 and 3 illustrate a fluid jet print head and stimulator therefor constructed according to a first embodiment of the present invention. The print head includes a manifold means consisting of an upper manifold element 10, a lower manifold element 12, and a gasket 14 therebetween. The manifold means defines a fluid receiving reservoir 16 to which fluid may be applied under pressure via fluid inlet tube 18. Fluid may be removed from reservoir 16 through outlet tube 20 during cleaning operations or prior to extended periods of print head shutdown.

An orifice plate 22 is mounted on the manifold means. The plate is formed of a metal material and is relatively thin so as to be somewhat flexible. Orifice plate 22 is bonded to the manifold element 12, as for example by solder or by an adhesive, such that it closes and defines one wall of the reservoir 16. Orifice plate 22 defines a plurality of orifices 24 which are arranged in at least one row and which communicate with the reservoir 16 such that fluid in the reservoir 16 flows through the orifices 24 and emerges therefrom as fluid filaments.

As is known, the fluid filaments, left to naturally occurring random stimulating disturbances, will tend to break up into drops of non-uniform size and spacing. In order to improve the uniformity of breakup, a stimulator means 26 mounted in contact with the orifice plate 22 vibrates the orifice plate to produce a series of bending waves which travel along the orifice plate 22 in a direction generally parallel to the row of orifices.

The stimulator means 26 includes a stimulator member 28, configured as a thin metal rod. The type of metal for the stimulator member 28 is selected to be compatible with the fluid supplied to reservoir 16. The stimulator member 28 is of a length L which is substantially equal to $n\lambda/2$, where n is a positive integer and $\lambda$ is the wavelength of an acoustic wave traveling along the stimulator member 28. As is known, the wavelength of such a wave, traveling along a thin rod, is substantially equal to $(Y/\rho)^{\frac{1}{2}}/f$, where Y is Young's modulus, $\rho$ is the density of the stimulator member material, and f is the frequency of acoustic waves generated in the member.

The end 30 of member 28 is tapered so that the member 28 contacts the orifice plate 22 substantially at a point. As is known, such point contact on the center line of the orifice plate 22 insures that bending waves of a first order are generated in the orifice plate 22, and that satisfactory stimulation is obtained.

The stimulator means 26 further includes piezoelectric crystal means, comprising piezoelectric crystals 32 and 34, which are mounted on the stimulator member 28. The crystals 32 and 34 each include a thin, electrically conductive layer on their outer surfaces to which conductors 36 and 38 are electrically connected. The inner surfaces of the crystals are in contact with and are grounded by the member 28. Member 28, in turn, may be grounded through orifice plate 22 or through ground conductor 40. The crystals 32 and 34 are configured such that they tend to compress or extend in a direction parallel to the axis of elongation of the member 28 when a fluctuating electrical potential is placed across the crystals. As a consequence, when an A.C. electrical drive signal is applied to lines 36 and 38 by driver circuit means 40, the crystals 32 and 34 produce acoustic waves in the stimulator member 28. The circuit 40 supplies an electrical drive signal at a frequency f, as specified above in relation to the length of the member 28.

In the embodiment illustrated in FIGS. 1–3, the stimulator member is substantially equal in length to one wavelength, that is, n is equal to 2. The member 28 extends into the manifold means through an opening 44 defined by element 10. The member 28 contacts the orifice plate 22 inside the reservoir 16. A seal, such as O-ring 46 surrounds the member 28, contacting the member 28 and element 10.

The stimulator means is mounted by tapered pins 48 which engage generally conical detents 50 in the sides of member 28. The pins 48 and detents 50 provide a pivotal mounting which restricts movement of member 28 vertically. As may be noted, the detents 50 are positioned $\frac{1}{4}\lambda$ from the upper end of the member 28, as seen in FIG. 2, while the O-ring 46 contacts the member 28 substantially $\frac{1}{4}\lambda$ from the lower end of the member 28. It will be appreciated that since crystals 32 and 34 extend above and below the detents 50 by substantially equal distances, pins 48 support the stimulator means in a nodal plane. Since the ring 46 contacts the member 28 $\frac{1}{2}\lambda$ below the pins 48, O-ring 46 also contacts the member 28 at a nodal plane. Thus substantial damping between the member 28 and the ring 46 does not occur. Additionally, the end of 30 of the member 28 is $\frac{1}{4}\lambda$ below a nodal plane and therefor at an anti-node, producing maximum amplitude mechanical stimulation for generation of the bending waves in the orifice plate 22. It will be understood that it is desirable to limit the length $L_c$ of the crystals 32 and 34 to $\frac{1}{2}\lambda$ or less. If the length of the crystals is greater than this, their vibratory motion will tend to counteract formation of standing waves in the member 28 and the production of nodal planes.

It will be appreciated that member 28 could be substantially longer than illustrated. The length of the member can be increased in multiples of $\frac{1}{2}$ wavelength with predictable harmonic progressions. In any event, however, it is desirable that the mounting for the member 28 be at a nodal plane and that sealing also occur at a nodal plane so that vibrational energy is not lost through the sealing or the mounting structures and that the member 28 contacts the orifice plate 22 at an anti-node.

An additional pair of piezoelectric crystals 52 may also be mounted on the member 28. Crystals 52 act as sensors and provide an electrical feedback signal on line 54 which is proportional in frequency and amplitude to the frequency and amplitude of the acoustic waves traveling through the member 28. The feedback signal on line 54 may be used by the driver circuit 40 to control the frequency and amplitude of the drive signal applied on lines 36 and 38.

Figure 4:
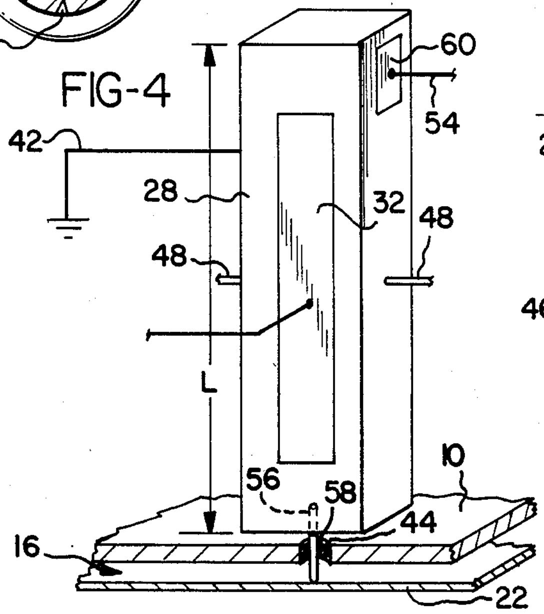
FIG. 4 is an enlarged perspective view of a second embodiment of the present invention, with portions broken away and in section.

FIG. 4 illustrates a second embodiment of the present invention in which the elements corresponding to the those in the first embodiment have been designated by the same numerals as those used in FIGS. 1-3. The stimulator member 28 of FIG. 4, rectangular in cross-section, is substantially ½ wavelength long, that is, L equals ½λ. Piezoelectric crystals 32 and 34 (not shown) are mounted on opposing faces of the member 28.

A vibration transmission pin 56 is mounted on one end of the member and is preferably pressed into a hole in the end of the member or is machined on the end of the member. The pin 56 directly transmits the movement of the lower end of the member 28 to the orifice plate 22. The pin 56 has a cross-sectional area, taken in a plane substantially perpendicular to the direction of the elongation of member 28, which is substantially less than the cross-sectional area of the member. Thus, the acoustic waves in the member 28 do not pass through pin 56, but rather are reflected back toward the nodal plane which passes through pins 48. The length of pin 56 is not related to the frequency of operation of the stimulator means, since the pin acts merely as a means of transmitting the vibrations from the anti-node at the end of member 28 to the plate 22. The pin 56 passes through opening 44 and is engaged by a small diameter O-ring 58 which prevents leakage of fluid from reservoir 16. Preferably, an automatic gain control in the driver circuit allows the stimulation amplitude to be held constant, regardless of the degree of damping provided by O-ring 58.

A single piezoelectric transducer 60 is mounted on a side of the member 28 other than the sides upon which the piezoelectric transducers 32 and 34 are mounted. Transducer 60 provides a feedback signal on line 54 which may be used by a driver circuit to control operation of the stimulator.

While the forms of apparatus herein described constitute preferred embodiments of this invention, it is to be understood that the invention is not limited to these precise forms of apparatus, and that changes may be made therein without departing from the scope of the invention which is defined in the appended claims.

What is claimed is:

1. A fluid jet print head for producing a plurality of jet drop streams, comprising:

manifold means, defining a fluid receiving reservoir to which fluid may be applied under pressure, orifice plate means mounted on said manifold means, said orifice plate means defining a plurality of orifices which communicate with said fluid receiving reservoir such that fluid from said reservoir flows through said orifices and emerges therefrom as fluid filaments, and stimulator means, mounted in contact with said orifice plate means, for vibrating said orifice plate means to produce a series of bending waves which travel along said orifice plate means and break up said fluid filaments into drops of substantially uniform size and spacing, said stimulator means comprising:

a stimulator member of a length L which is substantially equal to nλ/2, where n is a positive integer and λ is the wavelength of an acoustic wave traveling along the stimulator member, λ being equal to $(Y/\rho)^{\frac{1}{2}}/f$, where Y is Young's modulus, ρ is the density of the stimulator member, and f is the frequency of acoustic waves generated in said member, said member contacting said orifice plate means at one end of said member, piezoelectric crystal means mounted on said stimulator member, for alternately compressing and extending in a direction parallel to the axis of elongation of said member when driven by an electrical drive signal so as to produce acoustic waves in said member, said piezoelectric crystal means including a pair of piezoelectric crystals mounted on opposite sides of said member, said piezoelectric crystals being of a length which is less than or equal to ½λ, mounting means for supporting said stimulator member at a nodal plane therealong, and driver means for applying said electrical drive signal to said piezoelectric crystal means at said frequency f.

2. The fluid jet print head of claim 1 in which n is greater than or equal to 2, and in which said stimulator means contacts said orifice plate means inside said manifold means, said stimulator means entering said manifold means through an opening including a seal which contacts said stimulator member substantially at a nodal plane along said stimulator member.

3. The fluid jet print head of claim 1 in which n equals 1 and in which said stimulator means further includes a pin, mounted on the end of said stimulator member, in direct contact with said orifice plate means.

4. The print head of claim 3 in which said pin has a cross-sectional area, taken in a plane perpendicular to the axis of elongation of said member, which is substantially less than the cross-sectional area of said member taken in a parallel plane.

5. The fluid jet print head of claim 1 in which said stimulator means further comprises feedback transducer means, mounted at the end of said member opposite the end which contacts said orifice plate means, said feedback sensor means providing an electrical signal proportional in frequency and amplitude to the frequency and amplitude of the acoustic waves passing through said member.

6. The fluid jet print head of claim 1 in which said stimulator member is tapered toward the end thereof which contacts said orifice plate means such that said member contacts said orifice plate means substantially at a point.

7. A stimulator for mechanically vibrating a structure in response to an electrical drive signal of a frequency f, comprising:

an elongated stimulator member for contacting said structure, said member being of a length substantially equal to an integer half wavelength of acoustic waves of said frequency in said member, transducer means, mounted on said elongated stimulator member, for alternately compressing and extending a portion of said member in response to an A.C. drive signal, thereby producing acoustic waves in said member which travel parallel to the axis of elongation of said member, said transducer means comprising a pair of piezoelectric transducers bonded to opposite sides of said stimulator member, each transducer extending substantially an equal distance parallel to the axis of elongation of said member in opposite directions from a nodal plane, and being configured for compression and extension along said direction of extent, mounting means for supporting said stimulator member at a nodal plane, and driver means for applying said A.C. drive signal at said frequency to said transducer means, whereby acoustic waves travel along said member and are transmitted to said structure, producing mechanical vibration of said structure.

8. The stimulator of claim 7 in which the nodal plane from which said pair of piezoelectric transducers extend in opposite directions is the same nodal plane at which said mounting means supports said stimulator member.

9. The stimulator of claim 7 in which said transducers extend a distance less than $\lambda/4$ in opposite directions from a nodal plane.

10. The stimulator of claim 9 in which the stimulator member is one wavelength in length.

11. The stimulator of claim 10 in which the end of said stimulator member opposite said transducers is tapered to provide for contacting said structure with the tapered end of said member substantially at a point.

12. The stimulator of claim 9 in which said stimulator member is one-half wavelength in length.

13. The stimulator of claim 12 in which said stimulator member is of a generally rectangular shape in section, taken in a plane perpendicular to the axis of elongation of said member.

14. The stimulator of claim 13 in which said stimulator further comprises a vibration transmission pin, mounted on one end of said member, for directly transmitting the movement of said one end of said member to said structure to be vibrated.

15. The stimulator of claim 14 in which said pin has a cross-sectional area, taken in a plane substantially perpendicular to said direction of elongation of said member, which is substantially less than the cross-sectional area of said member taken in a parallel plane.

16. The stimulator of claim 15 further comprising sensor means, mounted on a side of said member other than the sides upon which said piezoelectric transducers are mounted, for providing an electrical feedback signal in response to vibration of said member.

17. The stimulator of claim 10 further comprising sensor means, mounted on a side of said member, for providing a feedback signal in response to acoustic waves traveling through said member.

18. The stimulator of claim 7 in which said mounting means comprises pivot means, engaging opposite sides of said stimulator member in said nodal plane, for supporting said member without affecting the transmission of acoustic waves therethrough.

* * * * *